United States Patent [19]

Hsu et al.

[11] Patent Number: 5,936,902
[45] Date of Patent: Aug. 10, 1999

[54] METHOD OF TESTING FOR SRAM PULL-DOWN TRANSISTOR SUB-THRESHOLD LEAKAGE

[75] Inventors: Chao-Shuenn Hsu, Tainan Hsien; Ji-Fu Chen, Chiayih Hsien, both of Taiwan

[73] Assignee: Winbond Electronics Corp., Hsinchu, Taiwan

[21] Appl. No.: 09/048,553

[22] Filed: Mar. 26, 1998

[30] Foreign Application Priority Data

Jan. 15, 1998 [TW] Taiwan ................................. 87100515

[51] Int. Cl.$^6$ ....................................................... G11C 7/00
[52] U.S. Cl. ............................................. 365/201; 365/154
[58] Field of Search ..................................... 365/201, 154, 365/156; 371/21.1

[56] References Cited

U.S. PATENT DOCUMENTS 5,568,435  10/1996  Marr ......................................... 365/201

Primary Examiner—Vu A. Le
Attorney, Agent, or Firm—Ladas & Parry

[57] ABSTRACT

A method of testing for SRAM pull-down transistor sub-threshold leakage is disclosed. The method according to the present invention can detect the problem of changes in store state resulting form sub-threshold leakage current flow through the parasitic resistor in SRAM, and therefore provides an advantageous way for the manufacturer to eliminate the defective products and thereby improve the reliability of SRAM.

9 Claims, 3 Drawing Sheets

"METHOD OF TESTING FOR SRAM PULL-DOWN TRANSISTOR SUB-THRESHOLD LEAKAGE

BACKGROUND OF THE INVENTION

1. Field of the Invention

The present invention relates in general to a testing method, more specifically, to a method of testing for static random access memory (SRAM) pull-down transistor sub-threshold leakage to pick out the defective SRAM products.

2. Description of the Related Art

SRAM is a commonly used memory device, and is volatile, that is when the power source supplied to SRAM is shut down, the data stored in SRAM disappear. The memory cells in SRAM are used for storing data by changing the conduction state of the internal transistors in a memory cell. This is quite different from dynamic RAM (DRAM) which stores data by charging and discharging capacitors. The access speed of SRAM is very fast so it is widely applied to computer systems as cache memory.

FIG. 1A illustrates a circuit block diagram of a SRAM cell. In the figure, a latch circuit consists of transistors M1, M2, M3, and M4, wherein transistors M3 and M4 serve as active loads or pull-up devices (M3 and M4 can be replaced with resistors). The complement logic signal pairs are generated at terminals X and Y, that is, the data written to memory cells are stored in the drain terminals of pull-down transistors M1 and M2. Word line W is used for addressing and controlling the on/off states of the controlling transistors M5 and M6. The data are written in or read from the terminals X and Y through the bit lines B and $\overline{B}$.

In FIG. 1A, the sources of the pull-down transistors M1 and M2 are connected to ground. However, because the path from source to ground is connected by a conductive line (such as polysilicon, metal, n+diffusion region) and the source of the pull-down transistor is made of a n+polysilicon region, there is parasitic resistance formed between the sources and ground. Consequently, the relationship between the sources of the pull-down transistors M1 and M2 can be depicted as FIG. 1B. In FIG. 1B, the source of the transistor M2 is grounded, and the source of the transistor M1 connected to the ground through an equivalent parasitic resistor Rn. The parasitic resistor Rn degrades the SRAM performance.

FIG. 2 illustrates a circuit diagram of two memory cells 1 and 2 at the adjoining word lines $WL_X$ and $WL_{X+1}$ respectively. The sources of the pull-down transistors 10 and 20 in cell 1 and 2 are connected together and grounded through a parasitic resistor Rs. The pull-up devices in the two memory cells are resistors (R1~R4).

Data "0" and "1" are written into terminals A and B in cell 1 respectively, and data "0" and "1" are written into terminals C and D in cell 2 respectively. In this case, the voltage at terminal A is of low logic "0" and the pull-down transistor 10 is turned on (because the voltage at terminal B is of high logic "1"), thereby generating a current $I_1$ flowing from the voltage source $V_{DD}$ through resistor R1, pull-down transistor 10, resistor Rs to ground. Similarly in cell 2, a current $I_2$ is generated and flows from the voltage source $V_{DD}$ through resistor R3, pull-down transistor 20, resistor Rs to ground.

When the word line $WL_X$ is activated or turned on, the transistors 14 and 16 in cell 1 are also turned on, and a current $I_P$ is generated and flows through pull-down transistor 10 and parasitic resistor Rs to ground. If the parasitic resistor has high resistance, the voltage at terminal Q is raised and high voltage is coupled to terminals A and C. Thus, the voltages to bias the gates of the transistors 12 and 22 are increased, and the sub-threshold leakage of the pull-down transistors 12 and 22 is increased, and the data stored in memory cells may be changed.

Furthermore, in the fabrication process of SRAM, the threshold voltage of the pull-down transistors 12 and 22 may be lower than the normal value due to ion implantation defects and channel effect, etc. Therefore, because the voltages to bias the gates of the transistors 12 and 22 are raised, transistors 12 and 22 may be turned on. Finally, for a long time period, the data "0" and "1" stored in A and B terminals will be changed to "1" and "0". Similarly, the data "0" and "1" stored in C and D terminals will be changed to "1" and "0".

The above mentioned problems is difficult to be detected in previous by general test methods. The effects due to the leakage of transistors 12 and 22 may occur, only when the word line have been turned on for a long time period. However, the operation of the SRAM is normal in the general state. Therefore, if the above mentioned problems occur, this causes the user serious trouble, and is difficult for the manufacturer to debug.

SUMMARY OF THE INVENTION

Therefore, an object of the present invention is to provide a method of testing for SRAM pull-down transistor sub-threshold leakage to overcome the above mentioned problems. The method can detect the defective product, thereby improving the quality of SRAM.

The present invention achieves the above-indicated objects by providing a method of testing for SRAM pull-down transistor sub-threshold leakage that comprises the following steps: (a) first, the test data are written to the under-testing memory cells of the SRAM to let a current flow through an equivalent resistor, wherein the equivalent resistor connects the sources of the first pull-down and the second pull-down transistors in every memory cell. (b) Next, one word line ($WL_X$) is turned on and kept on for a specific period, for example 100~200 ms. (c) The data stored in all memory cells adjoining the word line $WL_X$ is read out, that is, the memory cells on the word line $WL_{X-1}$ (or $WL_{X+1}$) are read, or the memory cells on the word line $WL_{X-1}$ and $WL_{X+1}$ are read simultaneously. (d) Then, the data read out are compared with the test data, wherein if the comparing results are not identical then the SRMA is classified as a defective product, while if the comparison results are the same, then (e) finally, whether all the word lines have been turned on or not is checked, if it is true then the SRAM passes the test, and if it is false then any other word line is turned on for a specific period and the steps (c), (d) are repeated.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1A:
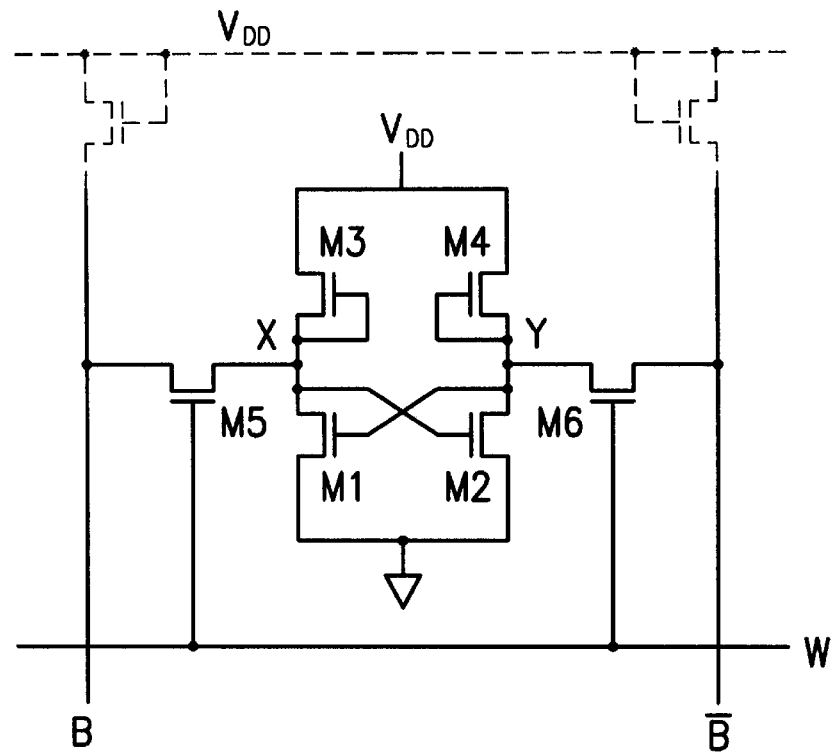
FIGS. 1A and 1B illustrate the circuit diagrams of SRAM memory cells.
Figure 1B:
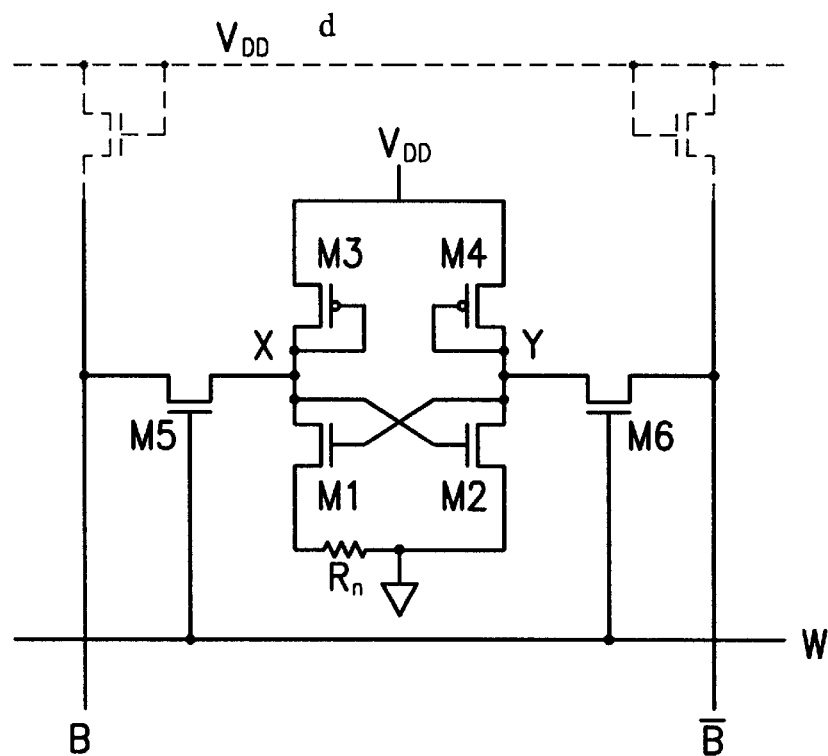
Figure 2:
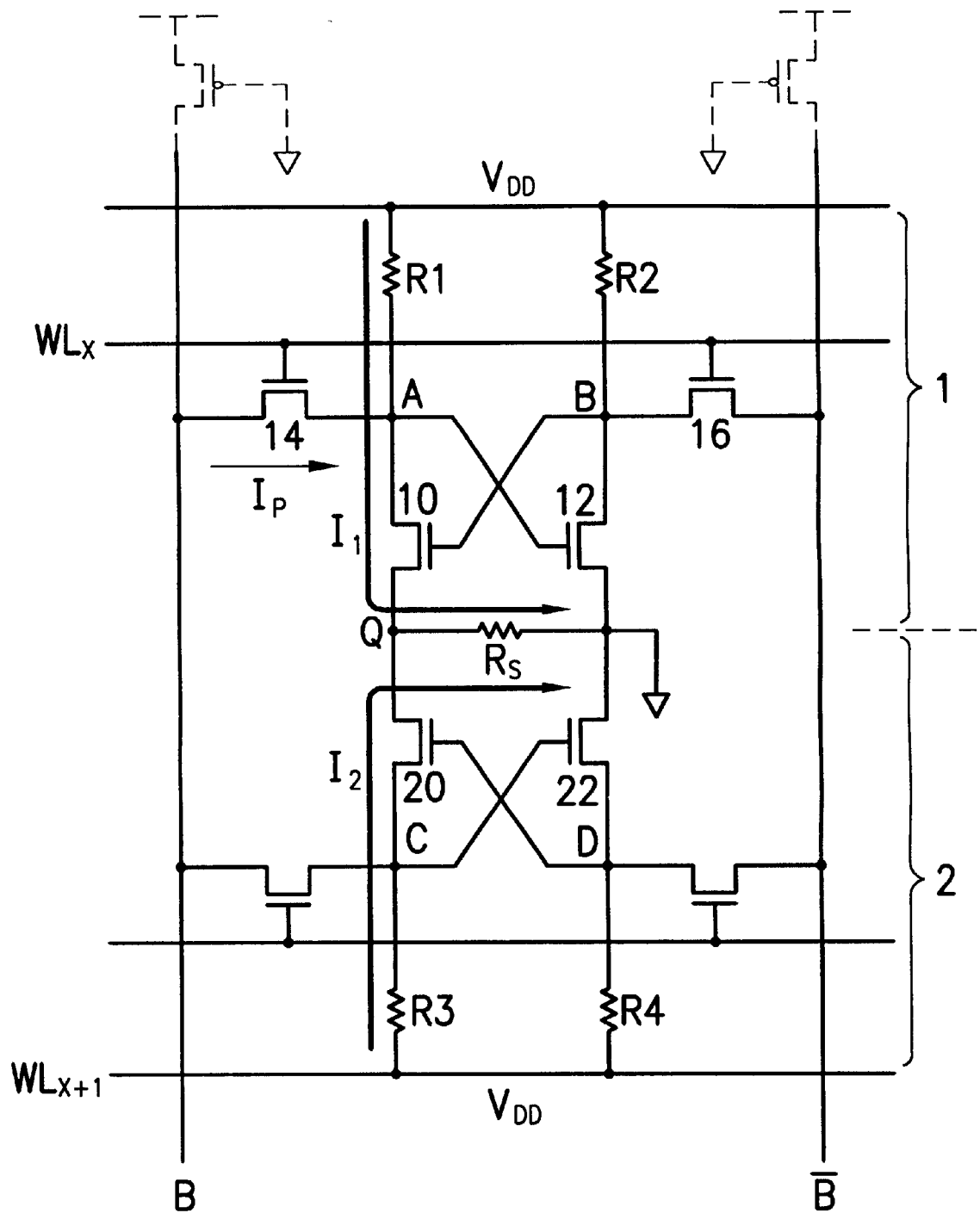
FIG. 2 illustrates a circuit diagram of two memory cells 1 and 2 at the adjoining word lines $WL_X$ and $WL_{X+1}$ respectively.
Figure 3:
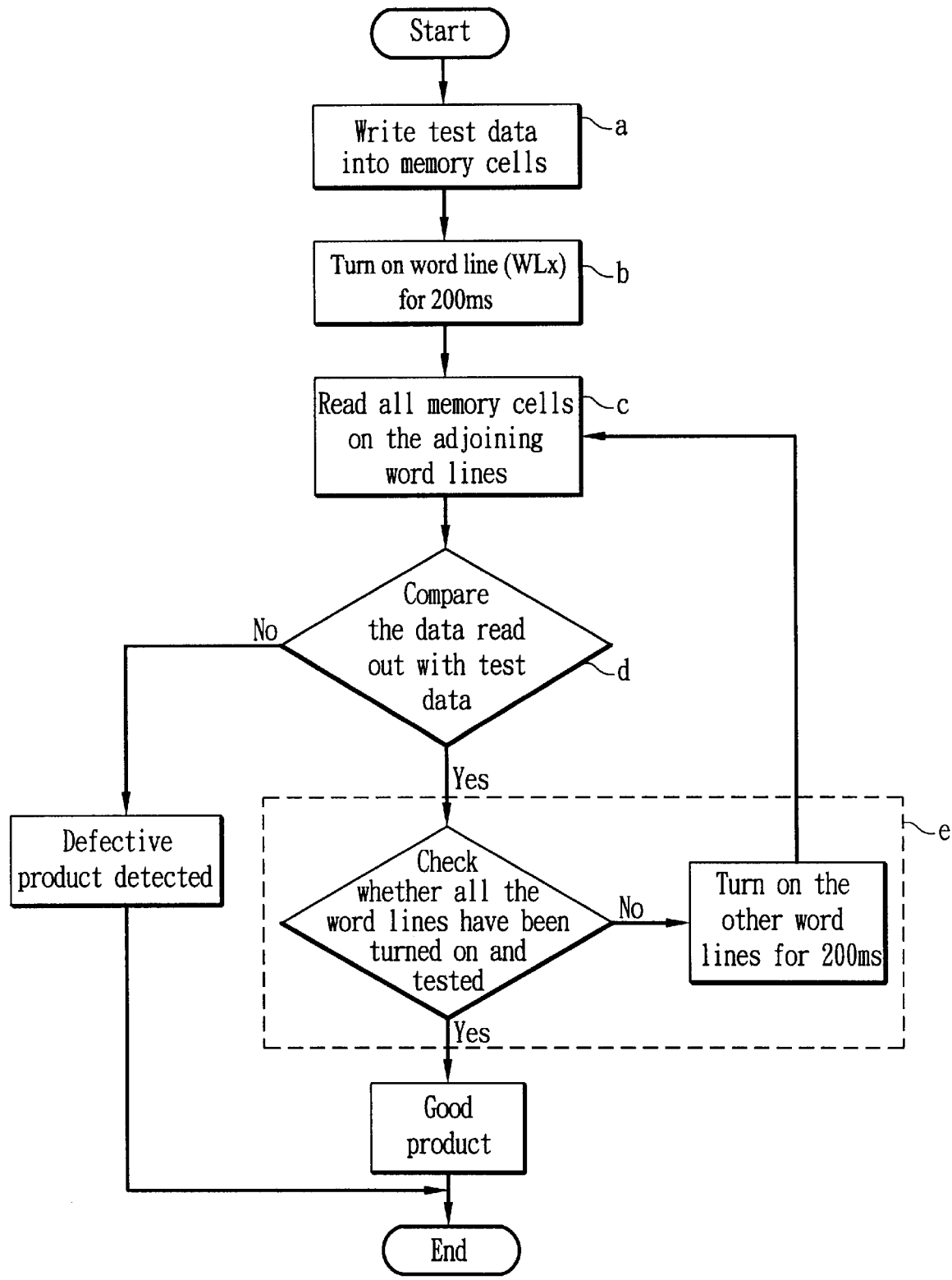
FIG. 3 illustrates the flow chart according to the present invention.

The flow chart according to the present invention is depicted in FIG. 3. The test method will be described in detail hereinafter in accompaniment with FIG. 2 and FIG. 3.

Step (a)

First, the test data are written to every memory cell of the SRAM, wherein data "0" and "1" are written into terminals A and B in memory cell 1, and data "0" and "1" are written into terminals C and D in memory cell 2 for example, such that a current flows through the parasitic resistor Rs.

Step (b)

(b) Next, any one word line ($WL_X$) is chosen to be turned on and kept on for a time period of 100~200 ms. In this embodiment, the time period is 200 ms.

Step (c)

The data stored in all memory cells adjoining the word line $WL_X$ is read out. In this embodiment, the memory cells on the word line $WL_{X+1}$ are read out. Alternatively, the memory cells on the word line $WL_{X-1}$ and $WL_{X+1}$ can be read out simultaneously to save the testing time.

Step (d)

Then the data read out are compared with the test data. If the comparison results are not the same, it means the additional current $I_p$ flowing through parasitic resistor Rs has made the sub-threshold leakage increase, or the threshold voltages of the transistors 12 and 22 are lower than normal and they are turned on, such that the data stored in the cells is changed during the long-duration turn-on operation of word line $WL_X$ in step (b) Therefore, the SRAM being tested is defectively. If the comparison results are the same, then the following step is taken.

Step (e)

(e) Finally, whether all the word line have been turned on or not is checked. If this is true, then the SRAM passes the test, while if it is false, then any other word line is turned on for a time period 200 ms and the steps (c), (d) are repeated.

It is quite obvious that the method according to the present invention is simple, practical, and can detect the problem of a change in store state resulting from sub-threshold leakage current flow through the parasitic resistor in SRAM.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of testing for SRAM pull-down transistor sub-threshold leakage comprising the steps of:

(a) writing test data to the under-testing memory cells of said SRAM to let currents flow through equivalent resistors, wherein every one of said equivalent resistor connects the sources of the first pull-down and the second pull-down transistors in every one of said under-testing memory cells;

(b) turning on one word line ($WL_X$) and keeping it on for a specific period;

(c) reading the data stored in the memory cells adjoining said word line $WL_X$, wherein said memory cells on the word line $WL_{X-1}$ or $WL_{X+1}$ have been read;

(d) comparing the data read out with said test data, wherein if the comparison results are not identical then said SRMA is classified as a defective product, and if the comparison results are the same then the following step is carried out;

(e) checking whether all the word lines have been turned on, if this is true then said SRAM passes the test; while if it is false, then any other word line is turned on for a specific period and the steps (c), (d) are repeated.

2. The method as claimed in claim 1, wherein the source of said pull-down transistor is grounded, and the test data stored in said first and second transistors are low logic "0" and high logic "1", respectively.

3. The method as claimed in claim 1, wherein said first and second pull-down transistors are coupled to a voltage source through a first and a second pull-up transistor respectively, and said current flows from said voltage source through said first pull-up transistor, said first pull-down transistor, and said equivalent resistor to ground.

4. The method as claimed in claim 1, wherein said memory cells on the word lines $WL_{X-1}$ and $WL_{X+1}$ can be read out simultaneously for comparison.

5. The method as claimed in claim 1, wherein said specific period for turning on said word line ($WL_X$) is within the ranges of 100~200 ms.

6. A Method of testing for SRAM pull-down transistor sub-threshold leakage comprising the steps of:

writing test data to every testing memory cell of said SRAM to let a current flow through an equivalent resistor, wherein said equivalent resistor connects the sources of the first pull-down and the second pull-down transistors in every memory cell, and said test data stored in said first and second transistors are low logic "0" and high logic "1", respectively;

turning on any one word line ($WL_X$) and keeping it on for a specific period;

reading the data stored in all memory cells adjoining said word line $WL_X$, wherein said memory cells on the word line $WL_{X-1}$ or $WL_{X+1}$ have been read;

comparing the data read out with said test data, wherein if the comparison results are not the same then said SRMA is classified as a defective product; while if the comparison result is the same, then the following step is carried out;

checking whether all the word line have been turned on, if this is true, then said SRAM passes the test; while if it is false, then any other word line is turned on for a specific period and the steps of reading and comparing the data are repeated.

7. The method as claimed in claim 6, wherein said first and second pull-down transistors are coupled to a voltage source through a first and a second pull-up transistor respectively, and said current flows from said voltage source through said first pull-up transistor, said first pull-down transistor, and said equivalent resistor to ground.

8. The method as claimed in claim 6, wherein said memory cells on the word lines $WL_{X-1}$ and $WL_{X+1}$ can be read out simultaneously for comparison.

9. The method as claimed in claim 6, wherein said specific period for turning on said word line ($WL_X$) is within the ranges of 100~200 ms.

* * * * *